US009644098B2

(12) United States Patent
Kamuro et al.

(10) Patent No.: US 9,644,098 B2
(45) Date of Patent: *May 9, 2017

(54) CURABLE RESIN COMPOSITION AND CURED PRODUCT THEREOF, ENCAPSULANT, AND SEMICONDUCTOR DEVICE

(71) Applicant: DAICEL CORPORATION, Osaka-shi, Osaka (JP)

(72) Inventors: Shigeaki Kamuro, Himeji (JP); Yasunobu Nakagawa, Ohtake (JP)

(73) Assignee: DAICEL CORPORATION, Osaka-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/837,025

(22) Filed: Aug. 27, 2015

(65) Prior Publication Data

US 2015/0368514 A1    Dec. 24, 2015

Related U.S. Application Data

(62) Division of application No. 14/767,861, filed as application No. PCT/JP2014/052519 on Feb. 4, 2014.

(30) Foreign Application Priority Data

Feb. 14, 2013 (JP) ................................ 2013-026947

(51) Int. Cl.
| | | |
|---|---|---|
| *H01L 23/29* | (2006.01) |
| *C08L 83/06* | (2006.01) |
| *C08L 83/04* | (2006.01) |
| *C08K 5/5435* | (2006.01) |
| *C09D 183/04* | (2006.01) |
| *C08K 5/54* | (2006.01) |
| *C08G 77/12* | (2006.01) |
| *C08G 77/20* | (2006.01) |
| *C08G 77/00* | (2006.01) |
| *H01L 33/56* | (2010.01) |
| *C08K 5/3492* | (2006.01) |

(52) U.S. Cl.
CPC ............ *C08L 83/06* (2013.01); *C08K 5/5435* (2013.01); *C08L 83/04* (2013.01); *C09D 183/04* (2013.01); *H01L 23/296* (2013.01); *C08G 77/12* (2013.01); *C08G 77/20* (2013.01); *C08G 77/80* (2013.01); *C08K 5/34924* (2013.01); *C08K 5/54* (2013.01); *H01L 33/56* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 2006/0252902 A1* | 11/2006 | Liao ........................ A61L 27/18 528/31 |
| 2008/0042142 A1 | 2/2008 | Sugawara et al. | |
| 2010/0125116 A1 | 5/2010 | Shiobara et al. | |
| 2012/0016083 A1* | 1/2012 | Kim ........................ C08L 83/04 525/100 |
| 2012/0029157 A1 | 2/2012 | Kim et al. | |
| 2012/0157624 A1 | 6/2012 | Saito | |
| 2012/0172544 A1 | 7/2012 | Liang et al. | |
| 2012/0220722 A1* | 8/2012 | Shiobara ................. C08L 83/14 525/100 |
| 2014/0332987 A1 | 11/2014 | Kamuro et al. | |

FOREIGN PATENT DOCUMENTS

| | | |
|---|---|---|
| EP | 0 803 529 A1 | 10/1997 |
| EP | 2 857 457 A1 | 4/2015 |
| JP | 09-291214 A | 11/1997 |
| JP | 2002-314140 A | 10/2002 |
| JP | 2004-131519 * | 4/2004 |
| JP | 2005-068268 A | 3/2005 |
| JP | 2005-307015 A | 11/2005 |
| JP | 2005-343984 A | 12/2005 |
| JP | 2006-206721 A | 8/2006 |
| JP | 2007-031619 A | 2/2007 |
| JP | 2007-224095 A | 9/2007 |
| JP | 2010-109034 A | 5/2010 |
| JP | 2010-138380 A | 6/2010 |
| JP | 2010-285507 A | 12/2010 |
| JP | 2011-88982 A | 5/2011 |
| JP | 2012-052029 A | 3/2012 |
| JP | 2012-111875 A | 6/2012 |
| JP | 2012-140617 A | 7/2012 |
| JP | 5830201 B2 | 12/2015 |
| WO | WO 2011/111667 A1 | 9/2011 |
| WO | WO 2013/094625 A1 | 6/2013 |

(Continued)

OTHER PUBLICATIONS

Japanese Office Action, issued Feb. 2, 2016, for Japanese Application No. 2015-207632, along with an English translation.
Japanese Office Action, issued Feb. 2, 2016, for Japanese Application No. 2015-500198, along with an English translation.
Extended European Search Report for European Application No. 14751942.5, dated Nov. 10, 2015.
Extended European Search Report for European Application No. 15002548.4, dated Nov. 11, 2015.

(Continued)

*Primary Examiner* — Marc Zimmer
(74) *Attorney, Agent, or Firm* — Birch, Stewart, Kolasch & Birch, LLP

(57) ABSTRACT

Provided is a curable resin composition capable of forming a cured product that has excellent heat resistance and transparency and, in particular, offers excellent barrier properties to a corrosive gas.
The curable resin composition according to the present invention includes a polyorganosiloxane (A), an isocyanurate compound (B), and a silane coupling agent (C). The polyorganosiloxane (A) is an aryl-containing polyorganosiloxane. The polyorganosiloxane (A) preferably includes a polyorganosiloxane having a number-average molecular weight (Mn) of 500 to 4000 as determined by gel permeation chromatography and calibrated with a polystyrene standard.

11 Claims, No Drawings

(56) References Cited

FOREIGN PATENT DOCUMENTS

WO     WO 2013/176238 A1    11/2013
WO     WO 2015/016001 A1     2/2015

OTHER PUBLICATIONS

International Search Report issued in PCT/JP2014/052519 dated May 27, 2014.

\* cited by examiner

CURABLE RESIN COMPOSITION AND CURED PRODUCT THEREOF, ENCAPSULANT, AND SEMICONDUCTOR DEVICE

This application is a Divisional of application Ser. No. 14/767,861, filed on Aug. 13, 2015, which is the National Stage Entry of PCT International Application No. PCT/JP2014/052519, filed on Feb. 4, 2014, which claims priority to Japanese Patent Application No. 2013-026947, filed in Japan on Feb. 14, 2013, all of which are hereby expressly incorporated by reference into the present application.

TECHNICAL FIELD

The present invention relates to curable resin compositions; as well as cured products, encapsulants, and semiconductor devices obtained using the curable resin compositions. The present application claims priority to Japanese Patent Application No. 2013-026947 filed in Japan on Feb. 14, 2013, the entire contents of which are incorporated herein by reference.

BACKGROUND ART

Semiconductor devices require high heat resistance and high breakdown voltage, in which semiconductor elements are covered or encapsulated by materials. These materials generally require such heat resistance as to endure heat at a temperature of about 150° C. or higher. In particular, materials (encapsulants) to cover or encapsulate optical elements such as optical semiconductor elements require excellent physical properties such as transparency and flexibility, in addition to the heat resistance. Such encapsulants currently used typically in backlight units of liquid crystal displays are exemplified by epoxy resin materials and silicone resin materials.

Patent Literature (PTL) 1 discloses a synthetic high-molecular compound as a material having high heat resistance and dissipating heat satisfactorily. The synthetic high-molecular compound contains at least one third organosilicon polymer having a molecular weight of from 20000 to 800000. The third organosilicon polymer has been formed by linking at least one first organosilicon polymer with at least one second organosilicon polymer through siloxane bonds. The first organosilicon polymer has a cross-linked siloxane structure, where the siloxane structure refers to a Si—O—Si bonded structure. The second organosilicon polymer has a linear linked siloxane structure. Materials of this type, however, are still insufficient in physical properties.

PTL 2 discloses a resin composition for optical element encapsulation as a resin composition that excels in transparency, ultraviolet resistance, and thermal coloration resistance and is used for the encapsulation of an optical element. The resin composition contains, as a resin component, at least one silsesquioxane selected from the group consisting of liquid silsesquioxanes having a cage-like structure, containing an aliphatic carbon-carbon unsaturated bond, and being devoid of H—Si bonds; and liquid silsesquioxanes having a cage-like structure, containing a H—Si bond, and being devoid of aliphatic carbon-carbon unsaturated bonds. Unfortunately, however, the resin composition containing such a cage-like silsesquioxane gives a cured product that is relatively rigid, is poorly flexible, and is susceptible to cracking and/or fracture.

PTL 3 discloses a curable composition that essentially contains an organic compound containing at least two carbon-carbon double bonds per molecule, a compound containing at least two SiH groups per molecule, and a hydrosilylation catalyst, where the carbon-carbon double bonds are reactive with SiH groups. The organic compound is exemplified by triallyl isocyanurate. The compound containing at least two SiH groups per molecule is exemplified by chain and/or cyclic polyorganosiloxanes. Disadvantageously, however, materials of this type are still insufficient in physical properties such as cracking resistance.

CITATION LIST

Patent Literature

PTL 1: Japanese Unexamined Patent Application Publication (JP-A) No. 2006-206721
PTL 2: JP-A No. 2007-031619
PTL 3: JP-A No. 2002-314140

SUMMARY OF INVENTION

Technical Problem

In addition to the heat resistance, transparency, and flexibility, encapsulants for optical semiconductor elements require resistance to deterioration even upon the application of heat at a high temperature in a reflow process in the production of optical semiconductor devices. Specifically, the encapsulants require such properties as to resist cracking and not to cause troubles such as detachment from the package. These properties are also generically referred to as "reflow resistance". As used herein the term "cracking resistance" refers to such a property of an encapsulant as to resist cracking.

In addition, the encapsulants for optical semiconductor elements require high barrier properties to a corrosive gas such as a $SO_X$ gas. This is because metal materials typically of electrodes in the optical semiconductor devices are readily corroded by the corrosive gas and, once corroded, disadvantageously deteriorate in electrical properties (e.g., electrical properties in a high-temperature environment) with time. Encapsulants using the conventional silicone resin materials are widely used as the encapsulants for optical semiconductor elements. Unfortunately, the encapsulants of this type have insufficient barrier properties to a corrosive gas. Likewise, the materials described in PTL 1 to 3 disadvantageously have insufficient barrier properties to a corrosive gas.

Accordingly, it is an object of the present invention to provide a curable resin composition capable of forming a cured product that has excellent heat resistance and transparency and, in particular, offers excellent barrier properties to a corrosive gas.

It is another object of the present invention to provide a cured product and an encapsulant, both of which have excellent heat resistance and transparency and, in particular, offer excellent barrier properties to a corrosive gas.

It is yet another object of the present invention to provide a semiconductor device that includes at least one of the cured product and the encapsulant (either one or both of the cured product and the encapsulant).

Solution to Problem

The present inventors have found a curable resin composition including an aryl-containing polyorganosiloxane incorporated with an isocyanurate compound and a silane coupling agent; and have found that this curable resin composition can form a cured product that has excellent heat resistance, transparency, and flexibility and, in particular, offers excellent reflow resistance and barrier properties to a corrosive gas. The present invention has been made based on these findings.

Specifically, the present invention provides a curable resin composition including a polyorganosiloxane (A), an isocyanurate compound (B), and a silane coupling agent (C). The polyorganosiloxane (A) is an aryl-containing polyorganosiloxane.

In the curable resin composition, the polyorganosiloxane (A) may include a polyorganosiloxane having a number-average molecular weight (Mn) of from 500 to 4000 as determined by gel permeation chromatography and calibrated with a polystyrene standard.

The polyorganosiloxane (A) in the curable resin composition may include a polyorganosiloxane having a molecular-weight dispersity (Mw/Mn) of from 0.95 to 4.00, where the polyorganosiloxane has a weight-average molecular weight of Mw and a number-average molecular weight of Mn as determined by gel permeation chromatography and calibrated with a polystyrene standard.

The polyorganosiloxane (A) in the curable resin composition may include a polyorganosiloxane (A1) containing an aliphatic carbon-carbon double bond.

The polyorganosiloxane (A) in the curable resin composition may include a polyorganosiloxane (A2) containing a S—H bond.

The polyorganosiloxane (A) in the curable resin composition may contain 50 percent by weight or more of the polyorganosiloxane (A2) containing a S—H bond based on the total amount (100 percent by weight) of the polyorganosiloxane (A).

The isocyanurate compound (B) in the curable resin composition may include an isocyanurate compound represented by Formula (1):

[Chem. 1]

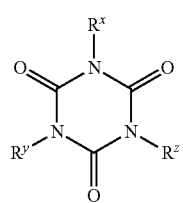

(1)

where $R^x$, $R^y$, and $R^z$ are each, identically or differently, selected from a group represented by Formula (2) and a group represented by Formula (3):

[Chem. 2]

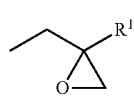

(2)

[Chem. 3]

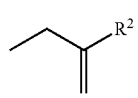

(3)

where $R^1$ and $R^2$ are each, identically or differently, selected from hydrogen and $C_1$-$C_8$ straight or branched chain alkyl.

In the curable resin composition, at least one of $R^x$, $R^y$, and $R^z$ in Formula (1) may be the group represented by Formula (3).

The present invention provides, in another aspect, a cured product of the curable resin composition.

The present invention provides, in yet another aspect, an encapsulant obtained by using the curable resin composition.

In addition and advantageously, the present invention provides a semiconductor device obtained by using the curable resin composition.

Specifically, the present invention relates to followings.

[1] A curable resin composition that includes a polyorganosiloxane (A), an isocyanurate compound (B), and a silane coupling agent (C). The polyorganosiloxane (A) is an aryl-containing polyorganosiloxane.

[2] In the curable resin composition according to [1], the polyorganosiloxane (A) may include a branched-chain-containing polyorganosiloxane.

[3] In the curable resin composition according to one of [1] and [2], the polyorganosiloxane (A) may contain aryl groups in a content (in terms of phenyl) of 35 percent by weight or more based on the total amount (100 percent by weight) of the polyorganosiloxane (A).

[4] In the curable resin composition according to any one of [1] to [3], the polyorganosiloxane (A) may include a polyorganosiloxane having a number-average molecular weight (Mn) of from 500 to 4000 as determined by gel permeation chromatography and calibrated with a polystyrene standard.

[5] In the curable resin composition according to any one of [1] to [4], the polyorganosiloxane [A] may include a polyorganosiloxane having a number-average molecular weight (Mn) of from 500 to 1000 as determined by gel permeation chromatography and calibrated with a polystyrene standard.

[6] In the curable resin composition according to any one of [1] to [5], the polyorganosiloxane (A) may include a polyorganosiloxane having a molecular-weight dispersity (Mw/Mn) of from 0.95 to 4.00, where the polyorganosiloxane has a weight-average molecular weight of Mw and a number-average molecular weight of Mn as determined by gel permeation chromatography and calibrated with a polystyrene standard.

[7] The curable resin composition according to any one of [1] to [6] may contain the polyorganosiloxane (A) in a content (blending quantity) of from 55 to 99.5 percent by weight based on the total amount (100 percent by weight) of the curable resin composition.

[8] In the curable resin composition according to any one of [1] to [7], the polyorganosiloxane (A) may include a polyorganosiloxysilalkylene.

[9] In the curable resin composition according to [8], the polyorganosiloxysilalkylene may include a polyorganosiloxysilalkylene having a structure represented by Formula (I) mentioned later.

[10] In the curable resin composition according to one of [8] and [9], the polyorganosiloxane (A) may contain the polyorganosiloxysilalkylene in a proportion of from 60 to 100 percent by weight based on the total amount (100 percent by weight) of the polyorganosiloxane (A).

[11] In the curable resin composition according to any one of [1] to [10], the polyorganosiloxane (A) may include a polyorganosiloxane (A1) containing an aliphatic carbon-carbon double bond.

[12] In the curable resin composition according to [11], the polyorganosiloxane (A1) may include a polyorganosiloxysilalkylene containing an aliphatic carbon-carbon double bond in molecule.

[13] In the curable resin composition according to [12], the polyorganosiloxysilalkylene containing an aliphatic carbon-carbon double bond in molecule may include a polyorganosiloxysilalkylene that contains, at its terminus and/or side chain, a group containing an aliphatic carbon-carbon double bond.

[14] In the curable resin composition according to [13], the polyorganosiloxysilalkylene containing an aliphatic carbon-carbon double bond in molecule may include a polyorganosiloxysilalkylene that contains, at its terminus and/or side chain, a group containing an aliphatic carbon-carbon double bond and includes the structure represented by Formula (I).

[15] In the curable resin composition according to any one of [11] to [14], the polyorganosiloxane (A) may contain the aliphatic carbon-carbon double bond in a content (in terms of vinyl) of from 1.5 to 15.0 percent by weight based on the total amount (100 percent by weight) of the polyorganosiloxane (A).

[16] In the curable resin composition according to any one of [11] to [15], the polyorganosiloxane (A1) may include, as an essential component, a polyorganosiloxane (A1) having an aliphatic carbon-carbon double bond content (in terms of vinyl) of 10.0 percent by weight or more.

[17] In the curable resin composition according to [16], the polyorganosiloxane (A1) having an aliphatic carbon-carbon double bond content (in terms of vinyl) of 10.0 percent by weight or more may have a weight-average molecular weight of 2000 or less.

[18] In the curable resin composition according to one of [16] and [17], the polyorganosiloxane (A1) having an aliphatic carbon-carbon double bond content (in terms of vinyl) of 10.0 percent by weight or more may have a number-average molecular weight of 1000 or less.

[19] In the curable resin composition according to any one of [16] to [18], the polyorganosiloxane (A) may contain the polyorganosiloxane (A1) having an aliphatic carbon-carbon double bond content (in terms of vinyl) of 10.0 percent by weight or more in a proportion of 1 to 10 percent by weight based on the total amount (100 percent by weight) of the polyorganosiloxane (A).

[20] In the curable resin composition according to any one of [1] to [19], the polyorganosiloxane (A) may include a polyorganosiloxane (A2) containing a S—H bond (S—H-bond-containing polyorganosiloxane (A2)).

[21] In the curable resin composition according to [20], the polyorganosiloxane (A2) may include a polyorganosiloxysilalkylene containing a S—H bond in molecule.

[22] In the curable resin composition according to [21], the polyorganosiloxysilalkylene containing a S—H bond in molecule may include a polyorganosiloxysilalkylene that contains, at its terminus and/or side chain, hydrogen (hydrido) bonded to silicon.

[23] In the curable resin composition according to one of [21] and [22], the polyorganosiloxysilalkylene containing a S—H bond in molecule may include a polyorganosiloxysilalkylene that contains, at its terminus and/or side chain, hydrogen bonded to silicon and has the structure represented by Formula (I).

[24] In the curable resin composition according to any one of [20] to [23], the polyorganosiloxane (A) may contain the S—H bond in a content in terms of H of from 0.01 to 0.50 percent by weight based on the total amount (100 percent by weight) of the polyorganosiloxane (A), where the term "in terms of H" refers to "in terms of the weight of hydrogen atom or H (hydrido) in S—H bond".

[25] In the curable resin composition according to any one of [20] to [24], the polyorganosiloxane (A) may contain 50 percent by weight or more of the polyorganosiloxane (A2) containing a S—H bond based on the total amount (100 percent by weight) of the polyorganosiloxane (A).

[26] In the curable resin composition according to any one of [1] to [25], the isocyanurate compound (B) may include an isocyanurate compound represented by Formula (1), in which $R^x$, $R^y$, and $R^z$ are each, identically or differently, selected from a group represented by Formula (2) and a group represented by Formula (3).

[27] In the curable resin composition according to [26], at least one of $R^x$, $R^y$, and $R^z$ in Formula (1) may be the group represented by Formula (3).

[28] In the curable resin composition according to one of [26] and [27], it is preferred that two of $R^x$, $R^y$, and $R^z$ are the groups represented by Formula (2) and the other one of $R^x$, $R^y$, and $R^z$ is the group represented by Formula (3).

[29] The curable resin composition according to any one of [1] to [28] may contain the isocyanurate compound (B) in a content of from 0.01 to 10 percent by weight based on the total amount (100 percent by weight) of the curable resin composition.

[30] The curable resin composition according to any one of [1] to [29] may contain the isocyanurate compound (B) in a content of from greater than 0.5 percent by weight to 10 percent by weight based on the total amount (100 percent by weight) of the curable resin composition.

[31] In the curable resin composition according to any one of [1] to [30], the silane coupling agent (C) may include an epoxy-containing silane coupling agent.

[32] The curable resin composition according to any one of [1] to [31] may contain the silane coupling agent (C) in a content of from 0.01 to 15 percent by weight based on the total amount (100 percent by weight) of the curable resin composition.

[33] The curable resin composition according to any one of [1] to [32] may contain the silane coupling agent (C) in a content of from greater than 2.0 percent by weight to 15 percent by weight based on the total amount (100 percent by weight) of the curable resin composition.

[34] The curable resin composition according to any one of [1] to [33] may have such a formulation (blending formulation) that an aliphatic carbon-carbon double bond is present in an amount of from 0.2 to 4 moles per mole of hydrosilyl groups present in the curable resin composition.

[35] The curable resin composition according to any one of [1] to [34] may have a viscosity of from 300 to 20000 mPa·s at 23° C.

[36] A cured product obtained by curing the curable resin composition according to any one of [1] to [35].

[37] An encapsulant obtained by using the curable resin composition according to any one of [1] to [35].

[38] A semiconductor device obtained by using the curable resin composition according to any one of [1] to [35].

[39] The semiconductor device according to [38] may be an optical semiconductor device.

Advantageous Effects of Invention

The curable resin composition according to the present invention, as having the configuration, excels particularly in barrier properties to a corrosive gas such as a $SO_X$ gas. In addition, the cured product, as including a silicone material, excels also in heat resistance and transparency. Accordingly, the curable resin composition according to the present invention is preferably usable as or for an encapsulant for optical semiconductor element encapsulation. The optical semiconductor element is exemplified by light-emitting diodes (LEDs), semiconductor laser elements, solar photovoltaic devices, and charge coupled devices (CODs). When the cured product of the curable resin composition according to the present invention is used for encapsulation of such an optical semiconductor element to give an optical semiconductor device, the resulting optical semiconductor device has excellent quality and durability. In particular, the curable resin composition according to the present invention is useful as or for an encapsulant for a next-generation light source which requires resistance to heat at an unprecedented high temperature (e.g., 180° C. or higher).

DESCRIPTION OF EMBODIMENTS

The curable resin composition according to the present invention is a curable resin composition including a polyorganosiloxane (A), an isocyanurate compound (B), and a silane coupling agent (C) as essential components. The polyorganosiloxane (A) is an aryl-containing polyorganosiloxane.

Polyorganosiloxane (A) The polyorganosiloxane (A) in the curable resin composition according to the present invention is a polyorganosiloxane having a main chain including siloxane bonds (Si—O—Si) and containing an aryl group as a substituent in the main chain. The polyorganosiloxane (A) may include a polyorganosiloxane having a straight chain and/or a branched chain. Among them, the polyorganosiloxane (A) preferably includes a polyorganosiloxane containing a branched chain from the viewpoint of the strength of the cured product.

The aryl group in the polyorganosiloxane (A) is exemplified by, but not limited to, $C_6$-$C_{14}$ aryl such as phenyl and naphthyl, of which $C_6$-$C_{10}$ aryl is preferred. The aryl group may also be a substituent on silicon atom in the polyorganosiloxane (A). The substituent herein refers to a group bonded directly to the silicon atom.

The aryl group in the polyorganosiloxane (A) may have one or more substituents. The substituents are exemplified by halogen, substituted or unsubstituted hydrocarbon groups, hydroxy, alkoxy, alkenyloxy, aryloxy, aralkyloxy, acyloxy, mercapto (thiol group), alkylthio, alkenylthio, arylthio, aralkylthio, carboxy, alkoxycarbonyl, aryloxycarbonyl, aralkyloxycarbonyl, amino or substituted amino (e.g., mono- or di-alkylamino and acylamino), epoxy, cyano, isocyanato, carbamoyl, and isothiocyanato.

The substituted or unsubstituted hydrocarbon groups are exemplified by aliphatic hydrocarbon groups, alicyclic hydrocarbon groups, aromatic hydrocarbon groups, and groups each including two or more of them bonded to each other.

The aliphatic hydrocarbon groups are exemplified by alkyl, alkenyl, and alkynyl. The alkyl is exemplified by $C_1$-$C_{20}$ alkyl such as methyl, ethyl, propyl, isopropyl, butyl, hexyl, octyl, isooctyl, decyl, and dodecyl, of which $C_1$-$C_{10}$ alkyl is preferred, and $C_1$-$C_4$ alkyl is more preferred. The alkenyl is exemplified by $C_2$-$C_{20}$ alkenyl such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl, of which $C_2$-$C_{10}$ alkenyl is preferred, and $C_2$-$C_4$ alkenyl is more preferred. The alkynyl is exemplified by $C_2$-$C_{20}$ alkynyl such as ethynyl and propynyl, of which $C_2$-$C_{10}$ alkynyl is preferred, and $C_2$-$C_4$ alkynyl is more preferred.

The alicyclic hydrocarbon groups are exemplified by $C_3$-$C_{12}$ cycloalkyl such as cyclopropyl, cyclobutyl, cyclopentyl, cyclohexyl, and cyclododecyl; $C_3$-$C_{12}$ cycloalkenyl such as cyclohexenyl; and $C_4$-$C_{15}$ bridged hydrocarbon groups such as bicycloheptyl and bicycloheptenyl.

The aromatic hydrocarbon groups are exemplified by $C_6$-$C_{14}$ aryl such as phenyl and naphthyl, of which $C_6$-$C_{10}$ aryl is preferred.

The groups each including the aliphatic hydrocarbon group and the alicyclic hydrocarbon group bonded to each other are exemplified by cyclohexylmethyl and methylcyclohexyl. The groups each including the aliphatic hydrocarbon group and the aromatic hydrocarbon group bonded to each other are exemplified by $C_7$-$C_{18}$ aralkyl such as benzyl and phenethyl, of which $C_7$-$C_{10}$ aralkyl is preferred; ($C_6$-$C_{10}$ aryl)-$C_2$-$C_6$ alkenyl such as cinnamyl; ($C_1$-$C_4$ alkyl)-substituted aryl such as tolyl; and ($C_2$-$C_4$ alkenyl)-substituted aryl such as styryl. The substituents of the substituted hydrocarbon groups (hydrocarbon groups substituted with one or more substituents) are as with the substituents which the aryl group may have.

The one or more substituents which the aryl group in the polyorganosiloxane (A) may have are further exemplified by a group represented by Formula (4):

[Chem. 4]

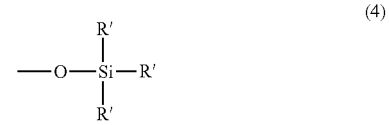

(4)

In Formula (4), plural (three) occurrences of R' may be identical or different. R' in Formula (4) is, independently in each occurrence, selected typically from hydrogen, halogen, substituted or unsubstituted hydrocarbon groups, hydroxy, alkoxy, alkenyloxy, aryloxy, aralkyloxy, acyloxy, mercapto (thiol group), alkylthio, alkenylthio, arylthio, aralkylthio, carboxy, alkoxycarbonyl, aryloxycarbonyl, aralkyloxycarbonyl, amino or substituted amino (e.g., mono- or di-alkylamino and acylamino), epoxy, cyano, isocyanato, carbamoyl, and isothiocyanato.

In the group represented by Formula (4), R' is, independently in each occurrence, preferably selected from hydrogen, $C_1$-$C_{10}$ alkyl (in particular, 1-$C_4$ alkyl), $C_2$-$C_{10}$ alkenyl (in particular, $C_2$-$C_4$ alkenyl), $C_3$-$C_{12}$ cycloalkyl, $C_3$-$C_{12}$ cycloalkenyl, $C_6$-$C_{14}$ aryl which may have one or more substituents (e.g., $C_1$-$C_4$ alkyl, $C_2$-$C_4$ alkenyl, halogen, and $C_1$-$C_4$ alkoxy) on the aromatic ring, $C_7$-$C_{18}$ aralkyl, ($C_6$-$C_{10}$ aryl) —$C_2$-$C_6$ alkenyl, hydroxy, $C_1$-$C_6$ alkoxy, and halogen.

The polyorganosiloxane (A) may contain the aryl group in a content (in terms of phenyl) not critical, but preferably 35 percent by weight or more, more preferably 40 percent by weight or more, and furthermore preferably 45 percent by weight or more (e.g., from 45 to 70 percent by weight), based on the total amount (100 percent by weight) of the polyorganosiloxane (A). The polyorganosiloxane (A), if containing the aryl group in a content less than 35 percent by weight, may cause the resulting cured product to have lower barrier properties to a corrosive gas such as $SO_x$. The aryl group may occupy all or part of the substituents on the main chain of the polyorganosiloxane (A), where the main chain includes siloxane bonds (Si—O—Si). The aryl content may be measured typically by $^1$H-NMR.

The polyorganosiloxane (A) may also contain one or more substituents other than aryl groups, and the substituents other than aryl groups may each be substituents on the silicon atom in the polyorganosiloxane (A). The substituents other than aryl groups are exemplified by hydrogen, halogen, Si—H bond-containing groups, substituted or unsubstituted hydrocarbon groups (of which alkyl, alkenyl, cycloalkyl, and cycloalkenyl are preferred), hydroxy, alkoxy, alkenyloxy, acyloxy, mercapto (thiol group), alkylthio, alkenylthio, carboxy, alkoxycarbonyl, amino or substituted amino (e.g., mono- or di-alkylamino and acylamino), epoxy, cyano, isocyanato, carbamoyl, and isothiocyanato.

Of the substituents other than aryl groups in the polyorganosiloxane (A), particularly preferred is at least one substituent selected from hydrogen, Si—H bond-containing groups (e.g., hydrosilyl), and substituted or unsubstituted hydrocarbon groups (of which alkyl and alkenyl are preferred).

The polyorganosiloxane (A) may have a number-average molecular weight (Mn) not critical, but preferably from 500 to 4000, more preferably from 550 to 2800, furthermore preferably from 600 to 1500, and particularly preferably 1000 or less. The polyorganosiloxane (A) may have a weight-average molecular weight (Mw) not critical, but preferably from 500 to 20000, more preferably from 600 to 10000, and furthermore preferably from 700 to 6500. The polyorganosiloxane (A), if having a number-average molecular weight (Mn) and/or a weight-average molecular weight (Mw) less than 500, may cause the resulting cured product to have lower heat resistance. In particular, the polyorganosiloxane (A), when having a number-average molecular weight of 1000 or less, may readily allow the cured product to have still better barrier properties to a corrosive gas. In contrast, the polyorganosiloxane (A), if having a number-average molecular weight (Mn) greater than 4000 and/or a weight-average molecular weight (Mw) greater than 20000, may have lower compatibility with another component, and/or may have lower compatibility with another polyorganosiloxane (A) in the case where the composition includes two or more different polyorganosiloxanes (A). The polyorganosiloxane (A) may also be a mixture including those having different number-average molecular weights (Mn) and/or different weight-average molecular weights (Mw) within the range. The number-average molecular weight (Mn) and the weight-average molecular weight (Mw) can be determined by calculation as molecular weights measured by gel permeation chromatography and calibrated with a polystyrene standard.

The polyorganosiloxane (A) may have a molecular-weight dispersity (Mw/Mn) not critical, but preferably from 0.95 to 4.00, more preferably from 1.00 to 3.80, and furthermore preferably from 1.20 to 3.50. The molecular-weight dispersity (Mw/Mn) is calculated from the weight-average molecular weight (Mw) and the number-average molecular weight (Mn). The polyorganosiloxane (A), if having a molecular-weight dispersity (Mw/Mn) greater than 4.00 (in particular, greater than 3.50), may cause the cured product to have inferior heat resistance and/or lower barrier properties to a corrosive gas such as $SO_X$.

The curable resin composition according to the present invention may contain one or more different polyorganosiloxanes alone or in combination as the polyorganosiloxane (A).

The curable resin composition according to the present invention may contain the polyorganosiloxane (A) in a content (blending quantity) not critical, but preferably from 55 to 99.5 percent by weight, more preferably from 70 to 99.0 percent by weight, and furthermore preferably from 85 to 98.5 percent by weight, based on the total amount (100 percent by weight) of the curable resin composition. The curable resin composition, if containing the polyorganosiloxane (A) in a content less than 55 percent by weight, may cause the cured product to have lower cracking resistance. In contrast, the curable resin composition, if containing the polyorganosiloxane (A) in a content greater than 99.5 percent by weight, may cause the cured product to have lower barrier properties to a corrosive gas such as $SO_X$.

Of such polyorganosiloxanes (A), particularly preferred is a polyorganosiloxysilalkylene. The term "polyorganosiloxysilalkylene" refers to a polyorganosiloxane including, as its main chain, not only the —Si—O— group (siloxy group), but also a —Si-A- group [silalkylene group; where A represents alkylene]. The alkylene moiety (the "A" moiety) in the silalkylene group of the polyorganosiloxysilalkylene is exemplified by $C_1$-$C_{12}$ straight or branched chain alkylene, of which $C_2$-$C_4$ straight or branched chain alkylene is preferred, and ethylene is particularly preferred. As compared with a polyorganosiloxane in a narrow sense (polyorganosiloxane having a main chain including —Si—O— groups alone), the polyorganosiloxysilalkylene less forms a low-molecular-weight ring upon production process and less decomposes due typically to heating and resulting silanol group (—SiOH) formation. The polyorganosiloxysilalkylene therefore gives a cured product that tends to less offer surface tack and to less suffer from yellowing. The polyorganosiloxysilalkylene may be produced typically by a method described in JP-A No. 2012-140617. The polyorganosiloxysilalkylene (aryl-containing polyorganosiloxysilalkylene) may also be available as products typically under the trade names of GD-1130A and GD-1130B (each from Eternal Chemical Co., Ltd.).

More specifically, the polyorganosiloxysilalkylene is exemplified by a polyorganosiloxysilalkylene having a structure represented by Formula (I):

[Chem. 5]

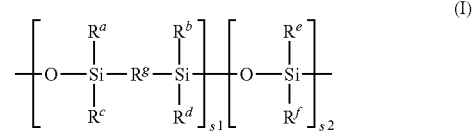

In Formula (I), $R^a$, $R^b$, $R^c$, $R^d$, $R^e$, and $R^f$ ($R^a$ to $R^f$) are, independently in each occurrence, selected from hydrogen, a monovalent hydrocarbon group, and a monovalent heterocyclic group. At least one of $R^a$ to $R^f$ may be selected from hydrogen and a monovalent group including an aliphatic carbon-carbon unsaturated bond. The polyorganosiloxysilalkylene having the structure represented by Formula (I) is one containing an aryl group in molecule. For this reason, part or all of $R^a$ to $R^f$ are preferably aryl groups (of which phenyl is more preferred).

The monovalent hydrocarbon group is exemplified by monovalent aliphatic hydrocarbon groups; monovalent alicyclic hydrocarbon groups; monovalent aromatic hydrocarbon groups; and monovalent groups each including two or more of aliphatic hydrocarbon groups, alicyclic hydrocarbon groups, and aromatic hydrocarbon groups bonded to each other. The monovalent heterocyclic group is exemplified by pyridyl, furyl, and thienyl.

The monovalent aliphatic hydrocarbon groups are exemplified by alkyl, alkenyl, and alkynyl. The alkyl is exemplified by straight or branched chain $C_1$-$C_{20}$ alkyl such as methyl, ethyl, propyl, isopropyl, butyl, hexyl, octyl, isooctyl, decyl, and dodecyl, of which $C_1$-$C_{10}$ alkyl is preferred, and $C_1$-$C_4$ alkyl is more preferred. The alkenyl is exemplified by $C_2$-$C_{20}$ alkenyl such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl, of which $C_2$-$C_{10}$ alkenyl is preferred, and $C_2$-$C_4$ alkenyl is more preferred. The alkynyl is exemplified by $C_2$-$C_{20}$ alkynyl such as ethynyl and propynyl, of which $C_2$-$C_{10}$ alkynyl is preferred, and $C_2$-$C_4$ alkynyl is more preferred.

The monovalent alicyclic hydrocarbon groups are exemplified by $C_3$-$C_{12}$ cycloalkyl such as cyclopropyl, cyclobutyl, cyclopentyl, cyclohexyl, and cyclododecyl; $C_3$-$C_{12}$ cycloalkenyl such as cyclohexenyl; and $C_4$-$C_{15}$ bridged hydrocarbon groups such as bicycloheptyl and bicycloheptenyl.

The monovalent aromatic hydrocarbon groups are exemplified by $C_6$-$C_{14}$ aryl such as phenyl, naphthyl, and anthryl, of which $C_6$-$C_{10}$ aryl is preferred.

The groups each including an aliphatic hydrocarbon group and an alicyclic hydrocarbon group bonded to each other is exemplified by cyclohexylmethyl and methylcyclohexyl. The groups each including an aliphatic hydrocarbon group and an aromatic hydrocarbon group bonded to each other is exemplified by $C_7$-$C_{18}$ aralkyl such as benzyl and phenethyl, of which $C_7$-$C_{10}$ aralkyl is preferred; ($C_6$-$C_{10}$ aryl)-$C_2$-$C_6$ alkenyl such as cinnamyl; ($C_1$-$C_4$ alkyl)-substituted aryl such as tolyl; and ($C_2$-$C_4$ alkenyl)-substituted aryl such as styryl.

The monovalent hydrocarbon group may have one or more substituents. Specifically, the monovalent hydrocarbon group may be a monovalent hydrocarbon group corresponding to any of the above-exemplified monovalent hydrocarbon groups, except with at least one hydrogen atom substituted with a substituent. The substituent(s) may contain carbon atoms in a number of preferably from 0 to 20, and more preferably from 0 to 10. Specifically, the substituent(s) is exemplified by halogen; hydroxy; alkoxy; alkenyloxy; aryloxy; aralkyloxy; acyloxy; mercapto; alkylthio; alkenylthio; arylthio; aralkylthio; carboxy; alkoxycarbonyl; aryloxycarbonyl; aralkyloxycarbonyl; amino; mono- or di-alkylamino; mono- or di-phenylamino; acylamino; epoxy-containing groups; oxetanyl-containing groups; acyl; oxo; isocyanato; and groups each including two or more of them bonded to each other, where necessary, through $C_1$-$C_6$ alkylene.

The alkoxy is exemplified by $C_1$-$C_6$ alkoxy such as methoxy, ethoxy, propoxy, isopropyloxy, butoxy, and isobutyloxy, of which $C_1$-$C_4$ alkoxy is preferred. The alkenyloxy is exemplified by $C_2$-$C_6$ alkenyloxy such as allyloxy, of which $C_2$-$C_4$ alkenyloxy is preferred. The aryloxy is exemplified by $C_6$-$C_{14}$ aryloxy which may have one or more substituents (e.g., $C_1$-$C_4$ alkyl, $C_2$-$C_4$ alkenyl, halogen, and $C_1$-$C_4$ alkoxy) on the aromatic ring, such as phenoxy, tolyloxy, and naphthyloxy. The aralkyloxy is exemplified by $C_7$-$C_{18}$ aralkyloxy such as benzyloxy and phenethyloxy. The acyloxy is exemplified by $C_1$-$C_{12}$ acyloxy such as acetyloxy, propionyloxy, (meth)acryloyloxy, and benzoyloxy.

The alkylthio is exemplified by $C_1$-$C_6$ alkylthio such as methylthio and ethylthio, of which $C_1$-$C_4$ alkylthio is preferred. The alkenylthio is exemplified by $C_2$-$C_6$ alkenylthio such as allylthio, of which $C_2$-$C_4$ alkenylthio is preferred. The arylthio is exemplified by $C_6$-$C_{14}$ arylthio which may have one or more substituents (e.g., $C_1$-$C_4$ alkyl, $C_2$-$C_4$ alkenyl, halogen, and $C_1$-$C_4$ alkoxy) on the aromatic ring, such as phenylthio, tolylthio, and naphthylthio. The aralkylthio is exemplified by $C_7$-$C_{18}$ aralkylthio such as benzylthio and phenethylthio. The alkoxycarbonyl is exemplified by $C_1$-$C_6$ alkoxy-carbonyl such as methoxycarbonyl, ethoxycarbonyl, propoxycarbonyl, and butoxycarbonyl. The aryloxycarbonyl is exemplified by ($C_6$-$C_{14}$ aryloxy)-carbonyl such as phenoxycarbonyl, tolyloxycarbonyl, and naphthyloxycarbonyl. The aralkyloxycarbonyl is exemplified by ($C_7$-$C_{18}$ aralkyloxy)-carbonyl such as benzyloxycarbonyl. The mono- or di-alkylamino is exemplified by mono- or di-($C_1$-$C_6$ alkyl)amino such as methylamino, ethylamino, dimethylamino, and diethylamino. The acylamino is exemplified by $C_1$-$C_{11}$ acylamino such as acetylamino, propionylamino, and benzoylamino. The epoxy-containing groups are exemplified by glycidyl, glycidyloxy, and 3,4-epoxycyclohexyl. The oxetanyl-containing groups are exemplified by ethyloxetanyloxy. The acyl is exemplified by acetyl, propionyl, and benzoyl. The halogen is exemplified by chlorine, bromine, and iodine.

The monovalent heterocyclic group may have one or more substituents. The substituents are exemplified by the substituents which the monovalent hydrocarbon group may have.

More specifically, the monovalent hydrocarbon group and the monovalent heterocyclic group are exemplified by methyl, ethyl, propyl, isopropyl, butyl, hexyl, octyl, decyl, phenyl, naphthyl, anthryl, benzyl, phenethyl, pyridyl, furyl, thienyl, vinyl, allyl, styryl (e.g., p-styryl), substituted hydrocarbon groups (e.g., 2-(3,4-epoxycyclohexyl)ethyl, 3-glycidylpropyl, 3-methacryloxypropyl, 3-acryloxypropyl, N-2-(aminoethyl)-3-aminopropyl, 3-aminopropyl, N-phenyl-3-aminopropyl, 3-mercaptopropyl, and 3-isocyanatopropyl).

$R^a$ to $R^f$ in Formula (I) may be identical or different.

In Formula (I), $R^g$ represents, independently in each occurrence, a divalent hydrocarbon group. The divalent hydrocarbon group is exemplified by straight or branched chain alkylene (e.g., a group represented by —[$CH_2$]$_t$—, where t represents an integer of 1 or more); and a divalent alicyclic hydrocarbon group. The straight or branched chain alkylene is exemplified by $C_1$-$C_{18}$ straight or branched chain alkylene such as methylene, methylmethylene, dimethylmethylene, ethylene, propylene, and trimethylene. The divalent alicyclic hydrocarbon group is exemplified by divalent cycloalkylene (including cycloalkylidene) such as 1,2-cyclopentylene, 1,3-cyclopentylene, cyclopentylidene, 1,2-cyclohexylene, 1,3-cyclohexylene, 1,4-cyclohexylene, and cyclohexylidene. Among them, $R^g$ is preferably, independently in each occurrence, straight or branched chain alkylene.

In Formula (I), s1 represents an integer of 1 or more. When s1 is an integer of 2 or more, two or more occurrences of the structure in the brackets with s1 may be identical or different. When the structure includes two or more different structures in the brackets with s1, the structures may be added to each other in a manner not limited. Typically, the structures may be added to each other in a random form and/or a block form.

In Formula (I), s2 represents an integer of 1 or more. When s2 is an integer of 2 or more, two or more structures in the brackets with s2 may be identical or different. When two or more different structures are present in the brackets with s2, the structures may be added to each other in a manner not limited. Typically, the structures may be added to each other in a random form and/or a block form.

In Formula (I), the structure in the brackets with s1 and the structure in the brackets with s2 may be added to each other in a manner not limited. Typically, the structures may be added to each other in a random form and/or a block form.

The polyorganosiloxysilalkylene may contain a terminal structure not limited, but exemplified by silanol group, alkoxysilyl, and trialkylsilyl (e.g., trimethylsilyl). The polyorganosiloxysilalkylene may include, at its terminus or termini, a variety of groups such as a group containing an aliphatic carbon-carbon double bond; and hydrosilyl group.

The polyorganosiloxysilalkylene having the structure represented by Formula (I) may have either a straight chain structure or a branched chain structure, as mentioned above.

The polyorganosiloxane (A) in the curable resin composition according to the present invention may contain the polyorganosiloxysilalkylene in a proportion not critical, but preferably 60 percent by weight or more (e.g., from 60 to 100 percent by weight), more preferably 80 percent by weight or more (e.g., from 80 to 99.5 percent by weight), and more preferably 90 percent by weight or more, based on the total amount (100 percent by weight) of the polyorganosiloxane (A). The polyorganosiloxane (A), if containing the polyorganosiloxysilalkylene in a proportion less than 60 percent by weight, may readily cause the cured product to be susceptible to yellowing and/or to readily have surface tack to thereby offer inferior handleability.

Polyorganosiloxane (A1) Containing Aliphatic Carbon-Carbon Double Bond

The polyorganosiloxane (A) in the curable resin composition according to the present invention may include a polyorganosiloxane (A1). The "polyorganosiloxane (A1)" herein refers to a polyorganosiloxane (A) containing an aliphatic carbon-carbon double bond. The aliphatic carbon-carbon double bond may be present in a substituent in the polyorganosiloxane (A1). The substituent is exemplified by a substituent on a silicon atom. The aliphatic carbon-carbon double bond may also be present at a terminus of the main chain (straight chain and/or branched chain) of the polyorganosiloxane (A1), where the main chain includes siloxane bonds (Si—O—Si).

A group containing the aliphatic carbon-carbon double bond is exemplified by $C_2$-$C_{20}$ alkenyl such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl, of which $C_2$-$C_{10}$ alkenyl is preferred, and $C_2$-$C_4$ alkenyl is more preferred; $C_3$-$C_{12}$ cycloalkenyl such as cyclohexenyl; $C_4$-$C_{15}$ bridged unsaturated hydrocarbon groups such as bicycloheptenyl; ($C_2$-$C_4$ alkenyl)-substituted aryl such as styryl; and cinnamyl. The group containing the aliphatic carbon-carbon double bond also includes the group represented by Formula (4) in which at least one of the three occurrences of R' is the above-mentioned group such as $C_2$-$C_{20}$ alkenyl, $C_3$-$C_{12}$ cycloalkenyl, $C_4$-$C_{15}$ bridged unsaturated hydrocarbon groups, $C_2$-$C_4$ alkenyl-substituted aryl, and cinnamyl. Among them, alkenyl is preferred, $C_2$-$C_{20}$ alkenyl is more preferred, and vinyl is furthermore preferred.

The curable resin composition according to the present invention preferably includes a polyorganosiloxysilalkylene containing an aliphatic carbon-carbon double bond in molecule as the polyorganosiloxane (A1). The polyorganosiloxysilalkylene is exemplified by a polyorganosiloxysilalkylene containing, at its terminus and/or side chain, a group containing an aliphatic carbon-carbon double bond. More specifically, the polyorganosiloxysilalkylene is exemplified by a polyorganosiloxysilalkylene that contains, at its terminus and/or side chain, a group containing an aliphatic carbon-carbon double bond and includes a structure represented by Formula (I); and a polyorganosiloxysilalkylene including a structure represented by Formula (I) in which at least one occurrence of $R^a$ to $R^f$ is a monovalent group containing an aliphatic carbon-carbon double bond.

The polyorganosiloxane (A) may contain the aliphatic carbon-carbon double bond in a content (in terms of vinyl) not critical, but preferably from 1.5 to 15.0 percent by weight, more preferably from 2.0 to 13.0 percent by weight, and furthermore preferably from 3.0 to 12.0 percent by weight, based on the total amount (100 percent by weight) of the polyorganosiloxane (A). The polyorganosiloxane (A), when containing the aliphatic carbon-carbon double bond in a content within the range, may readily allow the resulting cured product to excel in heat resistance and other physical properties, cracking resistance, and barrier properties to a corrosive gas. The content of the aliphatic carbon-carbon double bond may be measured typically by $^1$H-NMR.

The curable resin composition according to the present invention preferably includes, as the polyorganosiloxane (A1) and as an essential component, a polyorganosiloxane (A1) having an aliphatic carbon-carbon double bond content (in terms of vinyl) of 10.0 percent by weight or more (e.g., from 10.0 to 20.0 percent by weight). The curable resin composition, when containing the polyorganosiloxane (A1) of this type as an essential component, may readily allow the cured product to have remarkably better barrier properties to a corrosive gas and to exhibit such excellent barrier properties for a longer period of time.

The polyorganosiloxane (A1) having an aliphatic carbon-carbon double bond content (in terms of vinyl) of 10.0 percent by weight or more has a weight-average molecular weight of preferably 2000 or less (e.g., from 500 to 2000), and more preferably 1600 or less; and has a number-average molecular weight of preferably 1000 or less (e.g., from 400 to 1000), and more preferably 900 or less. In an embodiment, the polyorganosiloxane (A1) having an aliphatic carbon-carbon double bond content (in terms of vinyl) of 10.0 percent by weight or more has a weight-average molecular weight of 2000 or less and/or a number-average molecular weight of 1000 or less. The curable resin composition, when including this polyorganosiloxane (A1), may readily allow the cured product to have remarkably better barrier properties to a corrosive gas and to exhibit such excellent barrier properties for a still longer period of time.

The polyorganosiloxane (A) may contain the polyorganosiloxane (A1) having an aliphatic carbon-carbon double bond content (in terms of vinyl) of 10.0 percent by weight or more in a proportion of preferably from 1 to 10 percent by weight, and more preferably from 2 to 8 percent by weight, based on the total amount (100 percent by weight) of the polyorganosiloxane (A), where the polyorganosiloxane (A1) is preferably one having a weight-average molecular weight of 2000 or less and/or a number-average molecular weight of 1000 or less. Control of the proportion within the range may allow the curable resin composition to readily allow the cured product having strength and barrier properties to a corrosive gas both at satisfactorily levels.

Polyorganosiloxane (A2) Containing S—H Bond

The polyorganosiloxane (A) in the curable resin composition according to the present invention may include a polyorganosiloxane (A2). The "polyorganosiloxane (A2)" refers to a polyorganosiloxane (A) containing a S—H bond. The S—H bond may be present in a substituent in the polyorganosiloxane (A2). The substituent is exemplified by a substituent on the silicon atom. The S—H bond may also be present at a terminus of the main chain (straight chain and/or branched chain) of the polyorganosiloxane (A2), where the main chain includes siloxane bonds (Si—O—Si).

A group containing the S—H bond is exemplified by, but not limited to, a group represented by Formula (4) in which at least one of three occurrences of R' is hydrogen.

The curable resin composition according to the present invention preferably includes, as the polyorganosiloxane (A2), a polyorganosiloxysilalkylene containing a hydrosilyl group (S—H bond) in molecule. The polyorganosiloxysilalkylene is exemplified by a polyorganosiloxysilalkylene containing, at its terminus and/or side chain, hydrogen (hydrido) bonded to silicon. More specifically, the polyorganosiloxysilalkylene is exemplified by a polyorganosiloxysilalkylene that contains, at its terminus and/or side chain, hydrogen bonded to silicon and includes a structure represented by Formula (I); and a polyorganosiloxysilalkylene that includes a structure represented by Formula (I) in which at least one occurrence of $R^a$ to $R^f$ is hydrogen.

The polyorganosiloxane (A) may contain the S—H bond in a content in terms of H not critical, but preferably from 0.01 to 0.50 percent by weight, more preferably from 0.05 to 0.30 percent by weight, and furthermore preferably from 0.08 to 0.20 percent by weight, based on the total amount (100 percent by weight) of the polyorganosiloxane (A). The term "in terms of H" refers to "in terms of the weight of hydrogen or H (hydrido) in S—H bond". The polyorganosiloxane (A), when containing the S—H bond in a content within the range, may readily allow the resulting cured product to excel in heat resistance and other physical properties, cracking resistance, and barrier properties to a corrosive gas. The S—H bond content may be measured typically by $^1$H-NMR.

The polyorganosiloxane (A) may contain the polyorganosiloxane (A2) in a content not critical, but preferably 50 percent by weight or more (e.g., from 50 to 98 percent by weight), more preferably 80 percent by weight or more, and furthermore preferably 95 percent by weight or more, based on the total amount (100 percent by weight) of the polyorganosiloxane (A). The polyorganosiloxane (A), when containing the polyorganosiloxane (A2) in a content within the range, may readily allow the resulting cured product to excel in heat resistance and other physical properties, cracking resistance, and barrier properties to a corrosive gas.

The polyorganosiloxane (A1) may act also as a S—H-bond-containing polyorganosiloxane (A2); whereas the polyorganosiloxane (A2) may also act as a polyorganosiloxane (A1) containing an aliphatic carbon-carbon double bond.

The polyorganosiloxane (A) may include either one of the polyorganosiloxane (A1) and the polyorganosiloxane (A2) alone. The polyorganosiloxane (A) may also include two or more different polyorganosiloxanes (A1) and/or two or more different polyorganosiloxanes (A2).

In an embodiment, the polyorganosiloxane (A) includes two or more different polyorganosiloxanes, and at least one of the two or more different polyorganosiloxanes is the polyorganosiloxane (A2). In this embodiment, other polyorganosiloxane(s) excluding the polyorganosiloxane (A2) is preferably a polyorganosiloxane (A1) devoid of S—H bonds.

Isocyanurate Compound (B)

The curable resin composition according to the present invention includes an isocyanurate compound (B). The curable resin composition according to the present invention, as including the isocyanurate compound (B), particularly gives, when cured, a cured product having better barrier properties to a corrosive gas and offering better adhesion to an adherend. In particular, the curable resin composition preferably includes the isocyanurate compound represented by Formula (1) as the isocyanurate compound (B).

In Formula (1), $R^x$, $R^y$, and $R^z$ are each, identically or differently, selected from the group represented by Formula (2) and the group represented by Formula (3). In particular, one or more (preferably one or two, more preferably one) of $R^x$, $R^y$, and $R^z$ in Formula (1) is the group represented by Formula (3). The isocyanurate compound represented by Formula (1) particularly preferably contains, as $R^x$, $R^y$, and $R^z$, both the group represented by Formula (2) and the group represented by Formula (3). Specifically preferably in the isocyanurate compound represented by Formula (1), two of $R^x$, $R^y$, and $R^z$ are the groups represented by Formula (2), and the other one of $R^x$, $R^y$, and $R^z$ is the group represented by Formula (3). This is preferred so as to allow the cured product to have satisfactory barrier properties to a corrosive gas.

In Formulae (2) and (3), $R^1$ and $R^2$ are each, identically or differently, selected from hydrogen and $C_1$-$C_8$ straight or branched chain alkyl. The $C_1$-$C_8$ straight or branched chain alkyl is exemplified by methyl, ethyl, propyl, isopropyl, butyl, isobutyl, s-butyl, pentyl, hexyl, heptyl, octyl, and ethylhexyl. Of the alkyl, preferred is $C_1$-$C_3$ straight or branched chain alkyl such as methyl, ethyl, propyl, and isopropyl. $R^1$ and $R^2$ in Formulae (2) and (3) are each particularly preferably hydrogen.

The isocyanurate compound (B) is exemplified by, but not limited to, monoallyl dimethyl isocyanurate, diallyl monomethyl isocyanurate, triallyl isocyanurate, monoallyl diglycidyl isocyanurate, diallyl monoglycidyl isocyanurate, triglycidyl isocyanurate, 1-allyl-3,5-bis(2-methylepoxypropyl)isocyanurate, 1-(2-methylpropenyl)-3,5-diglycidylisocyanurate, 1-(2-methylpropenyl)-3,5-bis(2-methylepoxypropyl)isocyanurate, 1,3-diallyl-5-(2-methylepoxypropyl)isocyanurate, 1,3-bis(2-methylpropenyl)-5-glycidylisocyanurate, 1,3-bis(2-methylpropenyl)-5-(2-methylepoxypropyl)isocyanurate, and tris(2-methylpropenyl)isocyanurate. The curable resin composition may include each of different isocyanurate compounds alone or in combination as the isocyanurate compound (B).

For better compatibility with another component, the isocyanurate compound (B) may be mixed with the silane coupling agent (C) before being mixed with the other component, as described above.

The curable resin composition may contain the isocyanurate compound (B) in a content not critical, but preferably from 0.01 to 10 percent by weight, more preferably from 0.05 to 5 percent by weight, furthermore preferably from 0.1 to 3 percent by weight, and particularly preferably greater than 0.5 percent by weight, based on the total amount (100 percent by weight) of the curable resin composition. The curable resin composition, if containing the isocyanurate compound (B) in a content less than 0.01 percent by weight, may cause the cured product to have lower barrier properties to a corrosive gas and inferior adhesion to an adherend. In particular, the curable resin composition, when containing the isocyanurate compound (B) in a content greater than 0.5 percent by weight (e.g., in a content from greater than 0.5 percent by weight to 10 percent by weight), may readily allow the cured product to have remarkably better barrier properties to a corrosive gas and to exhibit such excellent barrier properties for a longer period of time. In contrast, the curable resin composition, if containing isocyanurate compound (B) in a content greater than 10 percent by weight, may undergo deposition of a solid therein and/or may cause the cured product to become clouded.

Silane Coupling Agent (C)

The curable resin composition according to the present invention includes a silane coupling agent (C). The curable resin composition according to the present invention, as including the silane coupling agent (C), gives, when cured, a cured product having better barrier properties to a corrosive gas and, in particular, having better adhesion to an adherend.

The silane coupling agent (C) has good compatibility typically with the polyorganosiloxane (A) and the isocyanurate compound (B). Typically, in an embodiment, the isocyanurate compound (B) is previously mixed with the silane coupling agent (C) to give a composite, and the composite is mixed with another component or components. This contributes to better compatibility of the isocyanurate compound (B) with the other component or components and may often give a homogeneous curable resin composition.

The silane coupling agent (C) for use herein may be selected from known or common silane coupling agents. Such silane coupling agents are exemplified by, but not limited to, epoxy-containing silane coupling agent such as 3-glycidoxypropyltrimethoxysilane, 2-(3,4-epoxycyclohexyl)ethyltrimethoxysilane, 3-glycidoxypropylmethyldiethoxysilane, and 3-glycidoxypropyltriethoxysilane; amino-containing silane coupling agents such as N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, and N-(β-aminoethyl)-γ-aminopropylmethyldiethoxysilane; and other silane coupling agents such as tetramethoxysilane, tetraethoxysilane, methyltriethoxysilane, dimethyldiethoxysilane, methyltriethoxysilane, vinyltriethoxysilane, vinyltrimethoxysilane, vinyltris(methoxyethoxy)silane, phenyltrimethoxysilane, diphenyldimethoxysilane, vinyltriacetoxysilane, γ-(meth)acryloxypropyltriethoxysilane, γ-(meth)acryloxypropyltrimethoxysilane, γ-(meth)acryloxypropylmethyldimethoxysilane, γ-(meth)acryloxypropylmethyldiethoxysilane, mercaptopropylenetrimethoxysilane, and mercaptopropylenetriethoxysilane. Among them, the epoxy-containing silane coupling agents are preferably usable, of which 3-glycidoxypropyltrimethoxysilane is more preferred. The curable resin composition may include each of different silane coupling agents alone or in combination as the silane coupling agent (C).

The curable resin composition may contain the silane coupling agent (C) in a content not critical, but preferably from 0.01 to 15 percent by weight, more preferably from 0.1 to 10 percent by weight, furthermore preferably from 0.5 to 5 percent by weight, and particularly preferably greater than 2.0 percent by weight, based on the total amount (100 percent by weight) of the curable resin composition. The curable resin composition, if containing the silane coupling agent (C) in a content less than 0.01 percent by weight, may cause the cured product to have lower adhesion to an adherend and may fail to exhibit sufficient effects (barrier properties to a corrosive gas) particularly when the isocyanurate compound (B) is mixed with the silane coupling agent (C) beforehand. In particular, the curable resin composition, when containing the silane coupling agent (C) in a content greater than 2.0 percent by weight (e.g., in a content from greater than 2.0 percent by weight to 15 percent by weight), may readily allow the cured product to have remarkably better barrier properties to a corrosive gas and to exhibit such excellent barrier properties for a longer period of time. In contrast, the curable resin composition, if containing the silane coupling agent (C) in a content greater than 15 percent by weight, may be cured insufficiently and may cause the cured product to have lower toughness, heat resistance, and/or barrier properties to a corrosive gas.

Hydrosilylation Catalyst

The curable resin composition according to the present invention may further include a hydrosilylation catalyst. The curable resin composition according to the present invention, when further including the hydrosilylation catalyst, may allow a curing reaction (hydrosilylation reaction) to proceed efficiently. The hydrosilylation catalyst may be selected from known catalysts for hydrosilylation reaction, such as platinum catalysts, rhodium catalysts, and palladium catalysts. Specifically, the hydrosilylation catalyst is exemplified by platinum catalysts including fine platinum powder, platinum black, platinum supported on fine silica powder, platinum supported on activated carbon, chloroplatinic acid, complexes of chloroplatinic acid with an alcohol, an aldehyde, or a ketone, platinum-olefin complexes, platinum-carbonyl complexes (e.g., platinum-carbonylvinylmethyl complex), platinum-vinylmethylsiloxane complexes (e.g., platinum-divinyltetramethyldisiloxane complex and platinum-cyclovinylmethylsiloxane complex), platinum-phosphine complexes, and platinum-phosphite complexes; and palladium catalysts and rhodium catalysts corresponding to the platinum catalysts, except for respectively containing palladium atom and rhodium atom instead of platinum atom. The curable resin composition may include each of different hydrosilylation catalysts alone or in combination as the hydrosilylation catalyst.

The curable resin composition according to the present invention may contain the hydrosilylation catalyst in a content not critical, but such a content that the amount of platinum, palladium, or rhodium in the hydrosilylation catalyst falls typically in the range of preferably from 0.01 to 1,000 ppm by weight, and more preferably from 0.1 to 500 ppm by weight. The curable resin composition, when containing the hydrosilylation catalyst in a content within the range, may not suffer from a remarkably low crosslinking rate and may not cause coloration and other disadvantages of the cured product, thus being preferred.

Hydrosilylation Inhibitor

The curable resin composition according to the present invention may include a hydrosilylation inhibitor so as to control the speed (rate) of curing reaction (hydrosilylation reaction). The hydrosilylation inhibitor is exemplified by alkyne alcohols such as 3-methyl-1-butyn-3-ol, 3,5-dimethyl-1-hexyn-3-ol, and phenylbutynol; ene-yne compounds such as 3-methyl-3-penten-1-yne and 3,5-dimethyl-3-hexen-1-yne; and other compounds such as thiazole, benzothiazole, and benzotriazole. The curable resin composition may include each of different hydrosilylation inhibitors alone or in combination as the hydrosilylation inhibitor. The curable resin composition may contain the hydrosilylation inhibitor in a content within the range of practically preferably from 0.00001 to 5 percent by weight based on the total amount of the curable resin composition, although the content may vary depending on the crosslinking conditions of the curable resin composition.

Silsesquioxane

The curable resin composition according to the present invention may further include a silsesquioxane. The silsesquioxane is exemplified by, but not limited to, silsesquioxanes each having any of random structure, cage structure, and ladder structure, of which preferred are silsesquioxanes including, as a principal component, a silsesquioxane having a ladder structure.

The "silsesquioxane" is a kind of polysiloxanes. Such polysiloxanes are generally compounds containing a main chain including siloxane bonds (Si—O—Si). Their basic constitutional units are exemplified by M unit, D unit, T unit, and Q unit. The M unit refers to a unit including a monovalent group containing a silicon atom bonded to one oxygen atom. The D unit refers to a unit including a divalent group containing a silicon atom bonded to two oxygen atoms. The T unit refers to a unit including a trivalent group containing a silicon atom bonded to three oxygen atoms. The Q unit refers to a unit including a tetravalent group containing a silicon atom bonded to four oxygen atoms. The silsesquioxane is a polysiloxane including the T unit as a basic constitutional unit and has an empirical formula (basic structural formula) represented by $RSiO_{1.5}$. The silsesquioxane includes a Si—O—Si skeleton having a structure selected typically from random structure, cage structure, and ladder structure. The above-mentioned ladder-like silsesquioxane is a silsesquioxane structurally including a Si—O—Si skeleton having a ladder structure.

The silsesquioxane may contain two or more aliphatic carbon-carbon double bonds in molecule (per molecule). The silsesquioxane may contain two or more S—H bond-containing groups in molecule (per molecule). The silsesquioxane is preferably, but not limitatively, liquid at room temperature. The curable resin composition may include each of different silsesquioxanes alone or in combination.

The curable resin composition according to the present invention, particularly when including one or more silsesquioxanes, may readily give, when cured, a cured product having better barrier properties to a corrosive gas and offering better toughness (in particular, cracking resistance). The curable resin composition according to the present invention may contain the silsesquioxane(s) in a content (blending quantity) not critical, but preferably from 0.01 to 30 percent by weight, more preferably from 0.1 to 20 percent by weight, and furthermore preferably from 0.5 to 10 percent by weight, based on the total amount (100 percent by weight) of the curable resin composition.

Other Siloxane Compound

The curable resin composition according to the present invention may further include, as another siloxane compound, a cyclic siloxane containing two or more aliphatic carbon-carbon double bonds in molecule (per molecule). The curable resin composition according to the present invention may further include, as another siloxane compound, a cyclic siloxane containing two or more S—H bonds in molecule (per molecule). The curable resin composition may include each of different cyclic siloxanes as above alone or in combination. The curable resin composition according to the present invention may contain the cyclic siloxane(s) in a content (blending quantity) not critical, but preferably from 0.01 to 30 percent by weight, more preferably from 0.1 to 20 percent by weight, and furthermore preferably from 0.5 to 10 percent by weight, based on the total amount (100 percent by weight) of the curable resin composition.

Other Silane Compound

The curable resin composition according to the present invention may include another silane compound (e.g., a compound containing a hydrosilyl group). The other silane compound is exemplified by straight or branched chain siloxanes containing a S—H group, such as methyltris(dimethylsiloxy)silane, tetrakis(dimethylsiloxy)silane, 1,1,3,3-tetramethyldisiloxane, 1,1,3,3,5,5-hexamethyltrisiloxane, 1,1,1,3,5,5,5-heptamethyltrisiloxane, 1,1,3,3,5,5,7,7-octamethyltetrasiloxane, 1,1,1,3,5,5,7,7,7-nonamethyltetrasiloxane, 1,1,3,3,5,5,7,7,9,9-decamethylpentasiloxane, and 1,1,1,3,5,5,7,7,9,9,9-undecamethylpentasiloxane. The curable resin composition may include each of different silane compounds alone or in combination. The curable resin composition may contain the silane compound(s) in a content not critical, but preferably from 0 to 5 percent by weight or less, and more preferably from 0 to 1.5 percent by weight, based on the total amount (100 percent by weight) of the curable resin composition.

Solvent

The curable resin composition according to the present invention may include a solvent. The solvent is exemplified by conventionally known solvents such as toluene, hexane, isopropanol, methyl isobutyl ketone, cyclopentanone, and propylene glycol monomethyl ether acetate. The curable resin composition may include each of different solvents alone or in combination.

Additives

The curable resin composition according to the present invention may further include any of common additives as additional optional components. The additives are exemplified by fillers as mentioned below; stabilizers such as antioxidants, ultraviolet absorbers, photostabilizers, and thermal stabilizers; flame retardants such as phosphorus flame retardants, halogen flame retardants, and inorganic flame retardants; flame retardant promoters; reinforcing materials such as other fillers; nucleating agents; coupling agents; lubricants; waxes; plasticizers; mold-release agents; impact modifiers; hue modifiers; flow improvers; colorants such as dyestuffs and pigments; dispersing agents; antifoaming agents; defoaming agents; antimicrobial agents; antiseptic agents (preservatives); viscosity modifiers; and thickeners. The fillers are exemplified by inorganic fillers such as precipitated silica, hydrous silica (wet silica), fumed silica, pyrogenic silica, titanium oxide, alumina, glass, quartz, aluminosilicate, iron oxide, zinc oxide, calcium carbonate, carbon black, silicon carbide, silicon nitride, and boron nitride, as well as inorganic fillers prepared by treating these fillers with any of organosilicon compounds such as organohalosilanes, organoalkoxysilanes, and organosilazanes; fine powders of organic resins such as silicone resins, epoxy resins, and fluorocarbon resins; and electroconductive powders of metals such as silver and copper. The curable resin composition may include each of different additives alone or in combination.

Curable Resin Composition

The curable resin composition according to the present invention may have a formulation (blending formulation) not critical, but preferably has such a formulation that the amount of aliphatic carbon-carbon double bonds is preferably from 0.2 to 4 moles, more preferably from 0.5 to 1.5 moles, and furthermore preferably from 0.8 to 1.2 moles, per mole of hydrosilyl group present in the curable resin composition. The curable resin composition, when containing hydrosilyl groups and aliphatic carbon-carbon double bonds in proportions controlled within the range, may readily allow the cured product to have still better heat resistance, transparency, flexibility, reflow resistance, and barrier properties to a corrosive gas.

Though not limited, the curable resin composition according to the present invention may be prepared by stirring and mixing the individual components at room temperature. The curable resin composition according to the present invention can be used as a one-part composition or a multi-part (e.g., two-part) composition. The one-part composition is prepared by mixing the individual components in advance and used as intact. The multi-part composition is used as storing two or more components separately and mixing them in predetermined proportions before use.

The curable resin composition according to the present invention is preferably, but not limitatively, liquid at room temperature (about 25° C.). More specifically, the curable resin composition according to the present invention has a viscosity at 23° C. of preferably from 300 to 20000 mPa·s, more preferably from 500 to 10000 mPa·s, and furthermore preferably from 1000 to 8000 mPa·s. The curable resin composition, if having a viscosity less than 300 mPa·s, may cause the cured product to have lower heat resistance. In contrast, the curable resin composition, if having a viscosity greater than 20000 mPa·s, may be prepared and handled with difficulty and may cause the cured product to contain air bubbles as remaining. The viscosity at 23° C. may be measured typically using a rheometer (trade name Physica UDS-200, supplied by Anton Paar GmbH) and a cone and a plate with a cone diameter of 16 mm and a taper angle of 0° at a temperature of 23° C. and a number of revolutions of 20 rpm.

Cured Product

The curable resin composition according to the present invention, when cured by a curing reaction (hydrosilylation reaction), can give a cured product. Hereinafter the resulting cured product is also referred to as "cured product according to the present invention". The curing reaction may be performed under any conditions that are not critical and selectable as appropriate from conventionally known conditions. However, from the viewpoint of reaction rate, the curing reaction is preferably performed at a temperature (curing temperature) of from 25° C. to 180° C. (more preferably from 60° C. to 150° C.) for a time (curing time) of from 5 to 720 minutes. The cured product according to the present invention has excellent physical properties such as heat resistance, transparency, and flexibility, still offers excellent reflow resistance, such as cracking resistance and adhesion to a package, in a reflow process, and excels in barrier properties to a corrosive gas such as a $SO_X$ gas.

Encapsulating Agent and Encapsulant

An encapsulating agent according to the present invention is an encapsulating agent including the curable resin composition according to the present invention as an essential component. The encapsulating agent according to the present invention, when cured, gives an encapsulant (cured product) according to the present invention. The encapsulant has excellent physical properties such as heat resistance, transparency, flexibility and still offers excellent reflow resistance and barrier properties to a corrosive gas. The encapsulant according to the present invention is therefore preferably usable as encapsulants for semiconductor elements in semiconductor devices and, in particular, as encapsulants for optical semiconductor elements in optical semiconductor devices. Of such optical semiconductor elements, the encapsulant is particularly preferably usable as encapsulants for optical semiconductor elements with high brightness and short wavelength. The encapsulant according to the present invention, when used for the encapsulation of a semiconductor element (in particular, an optical semiconductor element), gives a semiconductor device (in particular, an optical semiconductor device) that has excellent durability and quality.

EXAMPLES

The present invention will be illustrated in further detail with reference to several examples below. It should be noted, however, that the examples are by no means intended to limit the scope of the present invention.

Products were subjected to $^1$H-NMR analyses using the JEOL ECA500 (500 MHz). The products were also subjected to measurements of number-average molecular weight and weight-average molecular weight using the Alliance HPLC System 2695 (supplied by Waters Corporation), Refractive Index Detector 2414 (supplied by Waters Corporation), two Tskgel $GMH^{HR}$-M columns (supplied by Tosoh Corporation), the Tskgel guard column $H^{HR}L$ (supplied by Tosoh Corporation) as a guard column, the COLUMN HEATER U-620 (supplied by Sugai) as a column oven, and THF as a solvent at a measurement temperature of 40° C.

Polyorganosiloxane (A)

The polyorganosiloxane (A) used herein is any of products as follows:

OE-6665A: Product supplied by Dow Corning Toray Co., Ltd., having a vinyl content of 11.97 percent by weight, a phenyl content of 21.39 percent by weight, a SiH content (in terms of hydrido) of 0 percent by weight, a number-average molecular weight of 831, and a weight-average molecular weight of 1455

OE-6665B: Product supplied by Dow Corning Toray Co., Ltd. and having a vinyl content of 3.76 percent by weight, a phenyl content of 48.58 percent by weight, a SiH content (in terms of hydrido) of 0.16 percent by weight, a number-average molecular weight of 744, and a weight-average molecular weight of 1274

GD-1130A: Product supplied by Eternal Chemical Co., Ltd. and having a vinyl content of 4.32 percent by weight, a phenyl content of 44.18 percent by weight, a SiH content (in terms of hydrido) of 0 percent by weight, a number-average molecular weight of 1107, and a weight-average molecular weight of 6099

GD-1130B: Product supplied by Eternal Chemical Co., Ltd. and having a vinyl content of 3.45 percent by weight, a phenyl content of 50.96 percent by weight, a SiH content (in terms of hydrido) of 0.17 percent by weight, a number-average molecular weight of 631, and a weight-average molecular weight of 1305

ASP-1120A: Product supplied by Shin-Etsu Chemical Co., Ltd. and having a vinyl content of 5.94 percent by weight, a phenyl content of 64.61 percent by weight, a SiH content (in terms of hydrido) of 0 percent by weight, a number-average molecular weight of 590, and a weight-average molecular weight of 780

ASP-1120B: Product supplied by Shin-Etsu Chemical Co., Ltd. and having a vinyl content of 3.31 percent by weight, a phenyl content of 49.08 percent by weight, a SiH content (in terms of hydrido) of 0.30 percent by weight, a number-average molecular weight of 680, and a weight-average molecular weight of 1320

OE-6630A: Product supplied by Dow Corning Toray Co., Ltd. and having a vinyl content of 2.17 percent by weight, a phenyl content of 51.94 percent by weight, a SiH content (in terms of hydrido) of 0 percent by weight, a number-average molecular weight of 2532, and a weight-average molecular weight of 4490

OE-6630B: Product supplied by Dow Corning Toray Co., Ltd. and having a vinyl content of 3.87 percent by weight, a phenyl content of 50.11 percent by weight, a SiH content (in terms of hydrido) of 0.17 percent by weight, a number-average molecular weight of 783, and a weight-average molecular weight of 1330

KER-2500A: Product supplied by Shin-Etsu Chemical Co., Ltd. and having a vinyl content of 1.53 percent by weight, a phenyl content of 0 percent by weight, a SiH content (in terms of hydrido) of 0.03 percent by weight, a number-average molecular weight of 4453, and a weight-average molecular weight of 19355

KER-2500B: Product supplied by Shin-Etsu Chemical Co., Ltd. and having a vinyl content of 1.08 percent by weight, a phenyl content of 0 percent by weight, a SiH content (in terms of hydrido) of 0.13 percent by weight, a number-average molecular weight of 4636, and a weight-average molecular weight of 18814

GD-1012A: Product supplied by Eternal Chemical Co., Ltd. and having a vinyl content of 1.33 percent by weight, a phenyl content of 0 percent by weight, a SiH content (in terms of hydrido) of 0 percent by weight, a number-average molecular weight of 5108, and a weight-average molecular weight of 23385

GD-1012B: Product supplied by Eternal Chemical Co., Ltd. and having a vinyl content of 1.65 percent by weight, a phenyl content of 0 percent by weight, a SiH content (in terms of hydrido) of 0.19 percent by weight, a number-average molecular weight of 4563, and a weight-average molecular weight of 21873

Examples and Comparative Examples

Examples 1 to 5 and Comparative Examples 1 to 10 were performed by a procedure as follows.

In accordance with Tables 1 and 2, an isocyanurate compound (B) and a silane coupling agent (C) were mixed in a predetermined weight ratio to give a mixture, the mixture was further combined with polyorganosiloxanes (A), stirred at room temperature for 2 hours, and yielded a transparent solution. The blending quantities of individual components in Tables 1 and 2 are indicated in part by weight. The solution was combined with 1.3 µl of a 2.0% platinum-cyclovinylsiloxane complex vinylcyclosiloxane solution (supplied by Wako Pure Chemical Industries, Ltd.), stirred for further 30 minutes, and yielded a curable resin composition.

The above-prepared curable resin composition was applied to a glass plate, heated at a predetermined temperature for a predetermined time according to curing conditions given in Tables 3 and 4, and yielded a colorless, transparent cured product in each of the examples and comparative examples.

The column "Mw/Mn" in Tables 1 and 2 indicates the average of weight-average molecular weights (Mw), the average of number-average molecular weights (Mn), and the ratio of the average of weight-average molecular weights (Mw) to the average of number-average molecular weights (Mn) in the polyorganosiloxanes (A) used in each of the examples and comparative examples.

TABLE 1

| | Examples | 1 | 2 | 3 | 4 | 5 | Mw/Mn |
|---|---|---|---|---|---|---|---|
| Polyorganosiloxane (A) | OE-6665A | 10 | | | | | 1283/748 = 1.72 |
| | OE-6665B | | 200 | | | | |
| | GD-1130A | | | 25 | 25 | | 2264/726 = 3.10 |
| | GD-1130B | | | 100 | 100 | | |
| | ASP-1120A | | | | | 100 | 1050/635 = 1.65 |
| | ASP-1120B | | | | | 100 | |
| | OE-6630A | | | | | | 50 | 1962/1133 = 1.73 |
| | OE-6630B | | | | | | 200 | |
| Isocyanurate compound (B) | Monoallyl diglycidyl isocyanurate | 0.6 | 0.3 | | 0.4 | 0.5 | — |
| | Triallyl isocyanurate | | | 0.3 | | | — |
| Silane coupling agent (C) | 3-Glycidyloxypropyltrimethoxysilane | 2.4 | 1.0 | 1.0 | 1.6 | 2.0 | — |

TABLE 2

| | Comparative Examples | 1 | 2 | 3 | 4 | 5 | 6 | 7 | 8 | 9 | 10 | Mw/Mn |
|---|---|---|---|---|---|---|---|---|---|---|---|---|
| Polyorganosiloxane (A) | OE-6665A | 10 | | | | | | | | | | 1283/748 = 1.72 |
| | OE-6665B | 200 | | | | | | | | | | |
| | GD-1130A | | 25 | 25 | 25 | | | | | | | 2264/726 = 3.10 |
| | GD-1130B | | 100 | 100 | 100 | | | | | | | |
| | ASP-1120A | | | | | 100 | | | | | | 1050/635 = 1.65 |
| | ASP-1120B | | | | | 100 | | | | | | |
| | OE-6630A | | | | | | 50 | | | | | 1962/1133 = 1.73 |
| | OE-6630B | | | | | | 200 | | | | | |
| | KER-2500A | | | | | | | 100 | 100 | | | 19085/4545 = 4.20 |
| | KER-2500B | | | | | | | 100 | 100 | | | |
| | GD-1012A | | | | | | | | | 100 | 100 | 22629/4836 = 4.68 |
| | GD-1012B | | | | | | | | | 100 | 100 | |
| Isocyanurate compound (B) | Monoallyl diglycidyl isocyanurate | | | | | | | 0.4 | | 0.4 | | — |
| | Triallyl isocyanurate | 1.3 | | | | | | | | | | — |
| | Methyl diglycidyl isocyanurate | | | 1.3 | | | | | | | | — |
| Silane coupling agent (C) | 3-Glycidyloxypropyltrimethoxysilane | | | | | | | | 1.6 | | 1.6 | — |

Sulfur Corrosion Test

Each of the curable resin compositions prepared in Examples 1 to 5 and Comparative Examples 1 to 10 was poured into an LED package (TOP LED OP-3, 35 mm by 28 mm, without element), heated at a predetermined temperature for a predetermined time in accordance with curing conditions given in Tables 3 and 4, and yielded a sample.

The sample and 0.3 g of a sulfur powder (supplied by KISHIDA CHEMICAL Co., Ltd.) were placed in a 450-ml glass bottle, and the glass bottle was further placed in an aluminum case. Next, the aluminum case was placed in an oven (supplied by Yamato Scientific Co., Ltd., model number DN-64), the oven temperature was set at 80° C., and how the silver electrode in the LED package of the sample was corroded was observed 24 hours, 48 hours, and 72 hours later. The electrode appears silvery white before the test, but, when corroded, changes in color to dark brown, and further to black with the progress of corrosion. The criteria in the sulfur corrosion test are as follows. A sample undergoing little change in color in the silver electrode was evaluated as "A"; a sample undergoing a partial change in color to dark brown or black was evaluated as "B"; and a sample undergoing a full change in color to dark brown or black was evaluated as "C". Results are indicated in Tables 3 and 4.

Surface Tack Test

Each of the cured products prepared in Examples 1 to 5 and Comparative Examples 1 to 10 was evaluated on surface tack. The surface tack test was performed according to the criteria as follows. A sample cured product offering little tackiness on its surface was evaluated as "A"; and a sample cured product offering tackiness on its surface was evaluated as "B". Results are indicated in Tables 3 and 4.

TABLE 3

| Examples | | 1 | 2 | 3 | 4 | 5 |
|---|---|---|---|---|---|---|
| Sulfur corrosion test | 24 hrs later | A | A | A | A | A |
| | 48 hrs later | A | A | B | A | A |
| | 72 hrs later | A | B | C | B | B |
| Surface tack test | | B | A | A | B | B |
| Curing conditions | | 150° C. (2 hrs) | 80° C. (1 hr) then 150° C. (4 hrs) | 80° C. (1 hr) then 150° C. (4 hrs) | 100° C. (1 hr) then 150° C. (4 hrs) | 150° C. (2 hrs) |

TABLE 4

| Comparative Examples | | 1 | 2 | 3 | 4 | 5 | 6 | 7 | 8 | 9 | 10 |
|---|---|---|---|---|---|---|---|---|---|---|---|
| Sulfur corrosion test | 24 hrs later | A | A | A | A | B | C | C | C | C | C |
| | 48 hrs later | B | B | C | C | C | C | C | C | C | C |
| | 72 hrs later | C | C | C | C | C | C | C | C | C | C |
| Surface tack test | | B | A | A | A | B | B | B | B | A | A |
| Curing conditions | | 150° C. (2 hrs) | 80° C. (1 hr) then 150° C. (4 hrs) | 80° C. (1 hr) then 150° C. (4 hrs) | 80° C. (1 hr) then 150° C. (4 hrs) | 100° C. (1 hr) then 150° C. (4 hrs) | 150° C. (2 hrs) | 100° C. (1 hr) then 150° C. (4 hrs) | 100° C. (1 hr) then 150° C. (4 hrs) | 100° C. (1 hr) then 150° C. (4 hrs) | 100° C. (1 hr) then 150° C. (4 hrs) |

As demonstrated in Tables 3 and 4, the cured products (encapsulants) prepared in Examples 1 to 5 had better barrier properties to a corrosive gas as compared with those prepared in Comparative Examples 1 to 10. In particular, an example and a comparative example having an identical formulation of the polyorganosiloxanes (A) were compared with each other. Specifically, Example 1 was compared with Comparative Example 1, Examples 2 and 3 were compared with Comparative Examples 2 to 4, Example 4 was compared with Comparative Example 5, and Example 5 was compared with Comparative Example 6. In these comparisons, the example(s) had significantly better barrier properties to a corrosive gas as compared with the corresponding comparative example(s) particularly 48 hours and 72 hours after the initiation of test. In addition, Table 3 demonstrates that the samples according to Examples 2 and 3 using polyorganosiloxysilalkylenes as the polyorganosiloxanes (A) could give cured products that had little surface tack and offered excellent handleability.

INDUSTRIAL APPLICABILITY

The curable resin composition and cured product according to the present invention are useful particularly in adhesives, coating agents, encapsulants, and other uses that require heat resistance, transparency, and barrier properties to a corrosive gas. In particular, the curable resin composition and cured product according to the present invention are suitable as encapsulants for optical semiconductor elements such as light-emitting diodes (LEDs), semiconductor laser elements, solar photovoltaic elements, and charge coupled devices (CODs).

The invention claimed is:

1. A curable resin composition comprising:
   a polyorganosiloxane (A);
   an isocyanurate compound (B); and
   a silane coupling agent (C),
   the polyorganosiloxane (A) comprising
      a polyorganosiloxysilalkylene comprising a structure represented by Formula (I):

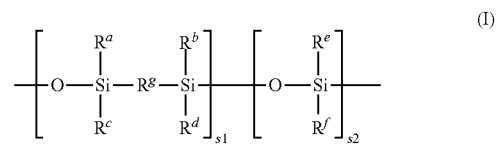

wherein $R^a$, $R^b$, $R^c$, $R^d$, $R^e$, and $R^f$ are, independently in each occurrence, selected from hydrogen, a monovalent hydrocarbon group, and a monovalent heterocyclic group, where at least one of $R^a$ to $R^f$ is an aryl group; $R^g$ represents, independently in each occurrence, a divalent hydrocarbon group; and s1 and s2 each independently represent an integer of 1 or more.

2. The curable resin composition according to claim 1, wherein the polyorganosiloxane (A) comprises
   a polyorganosiloxane having a number-average molecular weight (Mn) of from 500 to 4000 as determined by gel permeation chromatography and calibrated with a polystyrene standard.

3. The curable resin composition according to claim 1, wherein the polyorganosiloxane (A) comprises
   a polyorganosiloxane having a molecular-weight dispersity (Mw/Mn) of from 0.95 to 4.00, where the polyorganosiloxane has a weight-average molecular weight of Mw and a number-average molecular weight of Mn as determined by gel permeation chromatography and calibrated with a polystyrene standard.

4. The curable resin composition according to claim 1, wherein the polyorganosiloxane (A) comprises
   a polyorganosiloxane (A1) comprising an aliphatic carbon-carbon double bond.

5. The curable resin composition according to claim 1, wherein the polyorganosiloxane (A) comprises
   a polyorganosiloxane (A2) comprising a S—H bond.

6. The curable resin composition according to claim 5, wherein the polyorganosiloxane (A) comprises 50 percent by weight or more of the polyorganosiloxane (A2) comprising a S—H bond based on the total amount (100 percent by weight) of the polyorganosiloxane (A).

7. The curable resin composition according to claim 1, wherein the isocyanurate compound (B) comprises an isocyanurate compound represented by Formula (1):

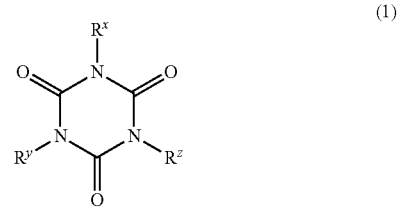

wherein $R^x$, $R^y$, and $R^z$ are each, identically or differently, selected from a group represented by Formula (2) and a group represented by Formula (3):

wherein $R^1$ and $R^2$ are each, identically or differently, selected from hydrogen and $C_1$-$C_8$ straight or branched chain alkyl.

8. The curable resin composition according to claim 7, wherein at least one of $R^x$, $R^y$, and $R^z$ in Formula (1) is the group represented by Formula (3).

9. A cured product of the curable resin composition according to claim 1.

10. An encapsulant obtained by using the curable resin composition according to claim 1.

11. A semiconductor device obtained by using the curable resin composition according to claim 1.

* * * * *